(12) United States Patent
Sauciuc

(10) Patent No.: US 7,532,476 B2
(45) Date of Patent: May 12, 2009

(54) FLOW SOLUTIONS FOR MICROELECTRONIC COOLING

(75) Inventor: Ioan Sauciuc, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/479,584

(22) Filed: Jun. 29, 2006

(65) Prior Publication Data

US 2008/0002359 A1    Jan. 3, 2008

(51) Int. Cl.
H05K 7/20 (2006.01)
F28D 15/00 (2006.01)

(52) U.S. Cl. ................ 361/704; 361/689; 361/690; 361/698; 361/700; 165/104.33; 165/185

(58) Field of Classification Search ......... 361/689–691, 361/694, 704, 699–703; 165/104.33, 185, 165/80.3–80.5; 174/15.2, 16.1, 16.3
See application file for complete search history.

(56) References Cited

U.S. PATENT DOCUMENTS

| | | | |
|---|---|---|---|
| 5,582,240 A * | 12/1996 | Widmayer | 165/80.3 |
| 5,927,385 A * | 7/1999 | Yeh | 165/80.3 |
| 6,415,612 B1 * | 7/2002 | Pokharna et al. | 62/3.2 |
| 6,561,267 B2 | 5/2003 | Sauciuc et al. | |
| 6,626,233 B1 * | 9/2003 | Connors | 165/80.3 |
| 6,639,799 B2 | 10/2003 | Prasher et al. | |
| 6,661,660 B2 | 12/2003 | Prasher et al. | |
| 6,868,898 B2 | 3/2005 | Chau et al. | |
| 6,966,361 B2 * | 11/2005 | Connors | 165/104.33 |
| 6,971,442 B2 | 12/2005 | Sauciuc et al. | |
| 7,082,031 B2 * | 7/2006 | Leija et al. | 361/700 |
| 7,128,140 B2 * | 10/2006 | Barmoav et al. | 165/185 |
| 2005/0068737 A1 * | 3/2005 | Leija et al. | 361/704 |
| 2006/0082971 A1 * | 4/2006 | Artman et al. | 361/700 |
| 2006/0131003 A1 | 6/2006 | Chang et al. | |

* cited by examiner

Primary Examiner—Jayprakash N Gandhi
Assistant Examiner—Robert J Hoffberg
(74) Attorney, Agent, or Firm—Kathy J. Ortiz; Intel Corporation

(57) ABSTRACT

Flow solutions for cooling one or more microelectronic device(s) are generally described. In this regard, according to one example embodiment, a cooling apparatus comprising a heat sink base coupled with a plurality of fins includes a first pathway for a fluid to flow across one or more of the fins and a second pathway for a fluid to flow across one or more fins in a direction substantially opposite the fluid in the first pathway.

26 Claims, 5 Drawing Sheets

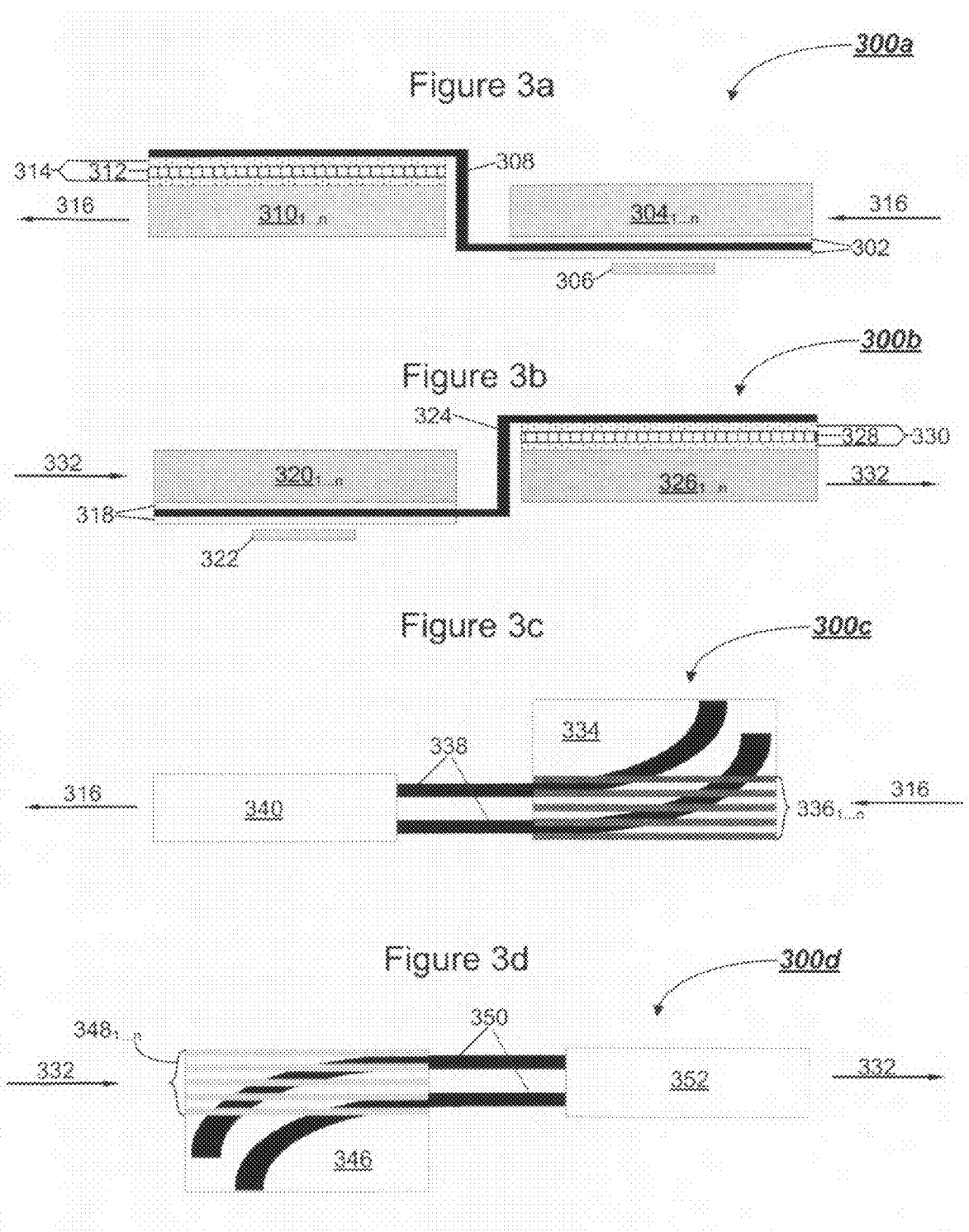

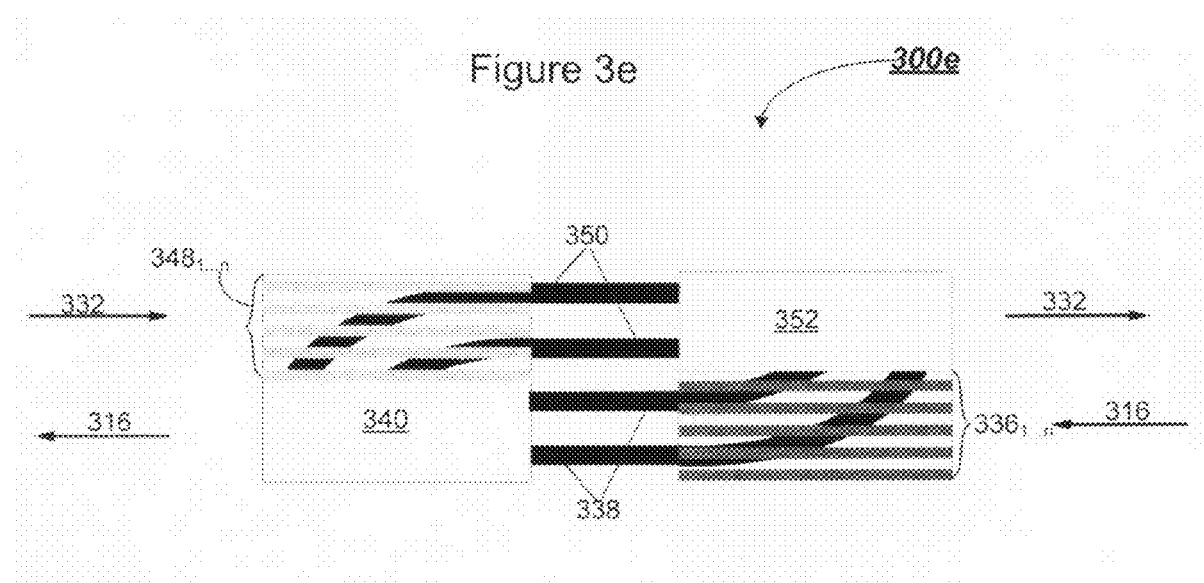

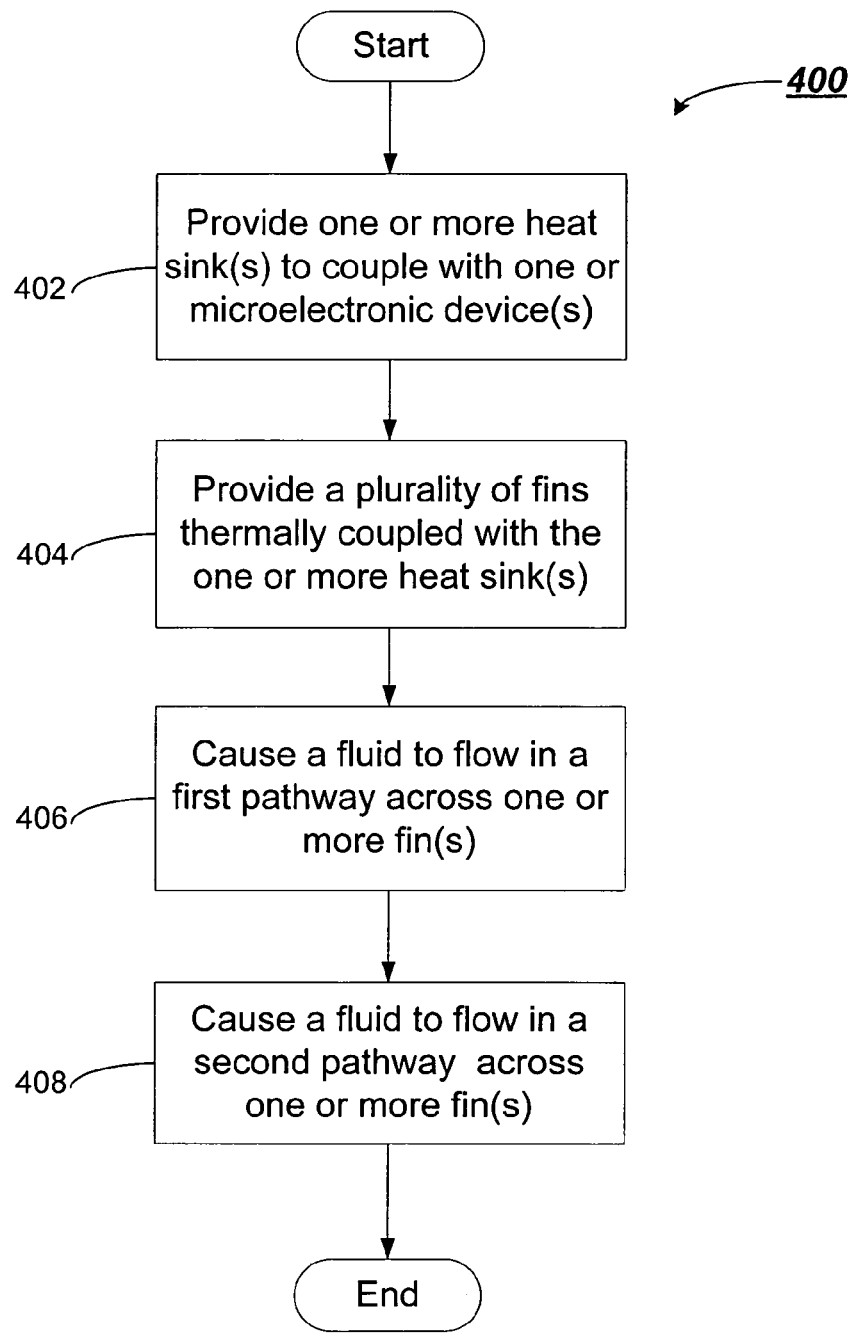

FLOW SOLUTIONS FOR MICROELECTRONIC COOLING

TECHNICAL FIELD

Embodiments of the present invention are generally directed to microelectronic cooling and, more particularly, to flow solutions for microelectronic cooling.

BACKGROUND

Microelectronic devices generate heat as a result of the electrical activity of the internal circuitry. In order to reduce the damaging effects of this heat, thermal management systems have been developed to remove the heat. Such thermal management systems have included heat spreaders, fans, and various combinations that are adapted to thermally couple with the microelectronic device.

With the development of faster, more powerful, and more densely packed microelectronic devices such as processors, traditional methods of cooling may be ineffective, inefficient, or impractical. For example, the development of multi-core processors may create additional heat dissipation challenges. A traditional cooling system may not adequately cool a second processor, for example, that receives the pre-heated air from a first processor. Therefore, improvements are needed to cool faster processors that are increasingly used in multi-core environments.

BRIEF DESCRIPTION OF THE DRAWINGS

Embodiments of the present invention are illustrated by way of example, and not by way of limitation, in the figures of the accompanying drawings in which like reference numerals refer to similar elements and in which:

FIG. 3a is a side view of an example microelectronic cooling assembly, according to but one example embodiment;

FIG. 3b is a side view of another example microelectronic cooling assembly, according to but one example embodiment;

FIG. 3c is a top view of an example microelectronic cooling assembly similar to the assembly depicted in FIG. 3a, according to but one example embodiment;

FIG. 3d is a top view of another example microelectronic cooling assembly similar to the assembly depicted in FIG. 3b, according to but one example embodiment;

FIG. 3e is a top view of an example flow arrangement using assemblies similar to those depicted in FIG. 3c and FIG. 3d, according to but one example embodiment; and FIG. 4 is a flowchart of an example method for microelectronic cooling, according to but one example embodiment.

DETAILED DESCRIPTION

Embodiments of a microelectronic cooling apparatus and corresponding methods are described herein. In the following description, numerous specific details are set forth to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the description.

Reference throughout this specification to "one embodiment" or "an embodiment" means that a particular feature, structure or characteristic described in connection with the embodiment is included in at least one embodiment of the present invention. Thus, appearances of the is phrases "in one embodiment" or "in an embodiment" in various places throughout this specification are not necessarily all referring to the same embodiment. Furthermore, the particular features, structures or characteristics may be combined in any suitable manner in one or more embodiments.

Figure 1:
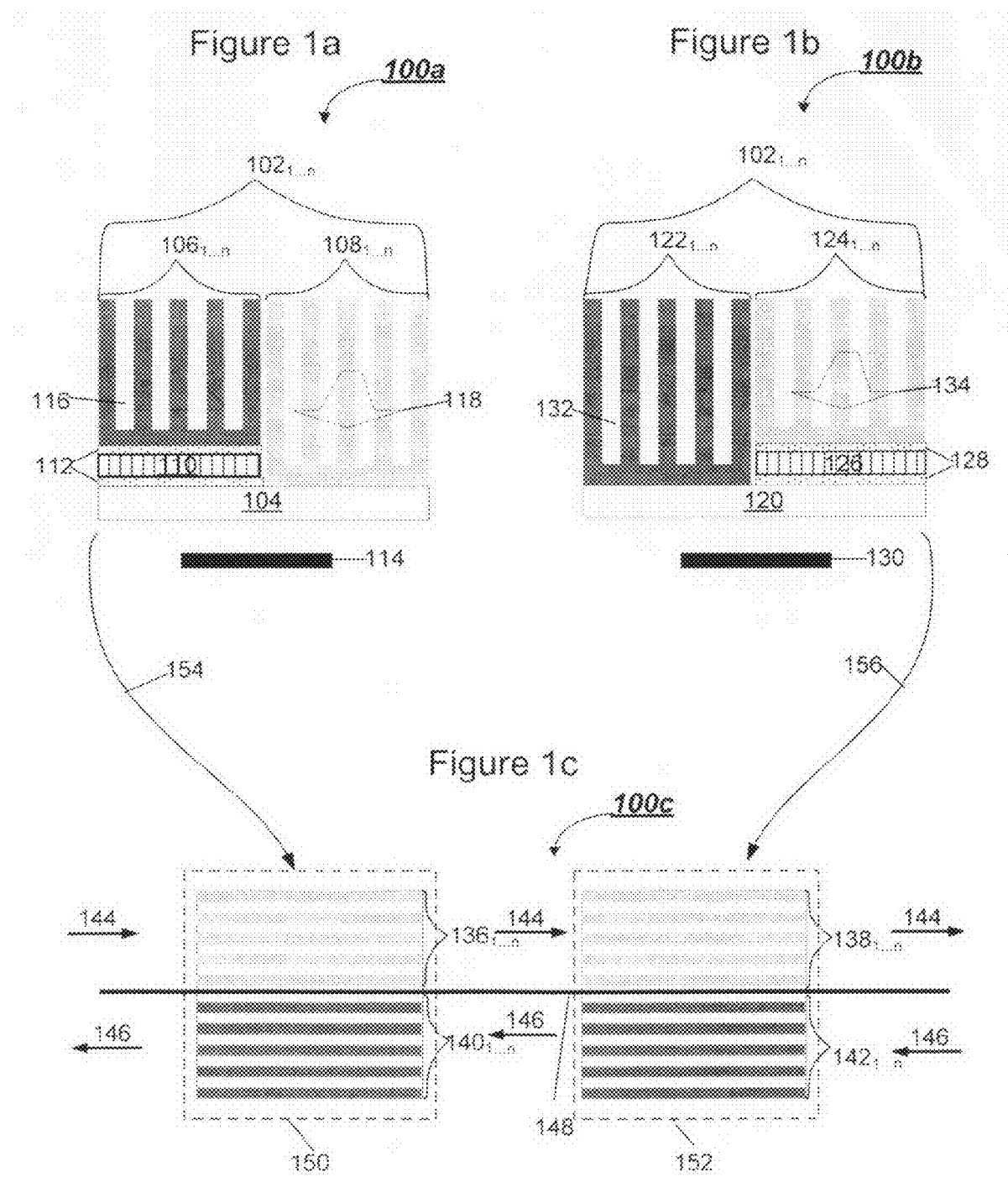
FIG. 1a is a side view of an example microelectronic cooling apparatus, according to but one example embodiment.
FIG. 1b is a side view of another example microelectronic cooling apparatus, according to but one example embodiment.
FIG. 1c is a view of an example flow arrangement using apparatuses similar to those depicted in FIG. 1a and FIG. 1b, according to but one example embodiment.

FIG. 1a is a side view of an example microelectronic cooling apparatus 100a, according to but one example embodiment. In one embodiment, a heat sink base 104 is be thermally coupled with a primary plurality of fins $102_{1...n}$ comprising at least fins $106_{1...n}$ and $108_{1...n}$ (where n represents a variable number of repeating structures). The heat sink base 104 may be adapted to thermally couple with one or more microelectronic device(s) 114.

In an embodiment, the cooling apparatus 100a includes a first pathway 116 for a fluid to flow between one or more fin(s) $106_{1...n}$ of the primary plurality of fins $102_{1...n}$ and/or across the surface of heat sink base 104. Fin(s) 106 in the first pathway 116 are in a first set of fin(s). A first set of fin(s) is defined to include any fins of the primary plurality of fins $102_{1...n}$ that are in the first pathway 116, which may include other fin(s) not shown in apparatus 100a that may also be in the flow path of a fluid in the first pathway 116. A primary plurality of fins $102_{1...n}$ includes fins that are coupled to a heat sink base 104 that may be adapted to thermally couple with a microelectronic device 114. This is in contrast with a secondary plurality of fins that will be introduced later, which includes fins that are coupled with a remote heat removal mechanism The first pathway 116 includes at least the area between the first set of fin(s) $106_{1...n}$. A fluid in the first pathway 116 may flow across the fin(s) $106_{1...n}$ and/or the surface of heat sink base 104 in a direction indicated by the first pathway 116 arrow (i.e.—into the page in this example).

In an embodiment, cooling apparatus 100a includes a second pathway 118 for a fluid to flow between one or more fin(s) $108_{1...n}$ of the primary plurality of fins $102_{1...n}$ and/or across the surface of heat sink base 104. Fin(s) $108_{1...n}$ in the second pathway 118 are included in a second set of fin(s). A second set of fin(s) is defined to include any fins of the primary plurality $102_{1...n}$ in the second pathway 118, which may include other fin(s) not shown in apparatus 100a that may also be in the flow path of a fluid in the second pathway 118. The second pathway 118 includes at least the area between the second set of fin(s) $108_{1...n}$. The fluid in the second pathway 118 may flow across the fin(s) $108_{1...n}$ and/or the surface of heat sink base 104 in a direction opposite or substantially opposite the direction of the fluid flow in the first pathway 116. The fluid in the second pathway 118 may flow in a direction indicated by the second pathway 118 arrow (i.e.—out of the page in this example). Direction is intended to indicate a general direction of the flow. Minor and/or temporary deviations from a certain direction are expected from turbulence and are in accord with the spirit of this description.

Embodiments described herein disclose cooling configurations that may significantly improve cooling performance for one or more microelectronic devices. Opposing pathways 116, 118 for fluid flow may provide several benefits to microelectronic cooling apparatus 100a. In a traditional cooling system with a fluid flowing in one direction, the fluid becomes heated as it travels across the cooling apparatus. Pre-heated fluid provides less effective cooling because the temperature difference between the fluid and elements such as fins and/or heat sink base of the cooling apparatus may be smaller. This pre-heating effect may reduce cooling effectiveness for portions of one or more microelectronic device(s) that are thermally coupled to portions of a cooling apparatus that encounter pre-heated fluid.

Opposing fluid flow across a cooling apparatus 100a may reduce the pre-heating effect. A first 116 and second 118 pathway allows fluid that hasn't been pre-heated to enter on opposing sides of a cooling apparatus 100a, which in turn mitigates pre-heating effects to the side of the cooling apparatus that in a traditional flow arrangement would have received a higher percentage of pre-heated air. Opposing fluid flow in a first pathway 116 and second pathway 118 may provide a benefit for a single microelectronic device 114 or multiple microelectronic devices 114. In one example, the pre-heating effect may be reduced by about 50% if opposite air flow is used for two processors in line. In an example embodiment, a flow arrangement suitable for multiple microelectronic devices is described in more detail below (See FIG. 1c for an example).

In one embodiment, air is a fluid for use in a first 116 and second pathway 118 of cooling apparatus 100a. The air may be from a common source such as ambient air. A blower or fan may be used to blow air into the first and second pathways. A diverter or series of diverters may direct the air into the first 116 and second 118 pathways of cooling apparatus 100a. A fluid suitable for use is not limited to air and may be any suitable fluid for cooling purposes.

In an embodiment, a thermoelectric cooler (TEC) 110 is thermally coupled with base 104 and fin(s) $106_{1...n}$ as shown. Fins $106_{1...n}$ may dissipate heat from the TEC 110. TEC 110 may be thermally coupled to base 104 and fin(s) $106_{1...n}$ using any suitable method. In one embodiment, TEC 110 is thermally coupled to base 104 and fin(s) $106_{1...n}$ using solder 112. In another embodiment, TEC 110 is thermally coupled to base 104 and fin(s) $106_{1...n}$ using thermal grease 112. In an embodiment, TEC 110 is a partial TEC (spans only a portion of heat sink base 104). In one embodiment, TEC 110 spans across approximately half of the heat sink base 104, but is not limited in this regard. In other embodiments, a TEC 110 may not be used as part of a cooling apparatus 100a. For example, fin(s) $106_{1...n}$ may be thermally coupled directly to heat sink base 104 without any TEC 110.

In an embodiment, a TEC 110 is positioned between a heat sink base 104 and one or more fin(s) $106_{1...n}$ to cool heat sink base 104, which in turn may be used to cool one or more microelectronic device(s) 114. A TEC 110 may have a cold side where heat is absorbed by electrons as they pass from a low energy level in a p-type semiconductor element, to a higher energy level in an n-type semiconductor element. A power supply provides the energy to move the electrons through the system. At a hot side, energy may be expelled to one or more fin(s) $106_{1...n}$ as electrons move from a higher energy level element (n-type) to a lower energy level element (p-type). In one embodiment, a cold side of TEC 110 is thermally coupled with heat sink base 104 and a hot side of TEC 110 is thermally coupled with one or more fin(s) $106_{1...n}$.

Fins $102_{1...n}$ (including fins $106_{1...n}$ and $108_{1...n}$) represent any feature that enhances heat transfer by increasing the surface area contact of the heat sink base 104 with a fluid. Fins $102_{1...n}$ may embody a variety of shapes, sizes, and suitable materials. In an embodiment, cooling apparatus 100a does not have any fins $102_{1...n}$. The benefits of opposing air flow may be realized without any fins.

Heat sink base 104 may comprise any material that conducts heat. For example, heat sink base may be a metal or combination of metals such as copper or aluminum. In one embodiment, heat sink base 104 includes a vapor chamber. Heat sink base 104 may be thermally coupled to one or more microelectronic device(s) 114 using any suitable method. In one embodiment, heat sink base 104 is thermally coupled to a microelectronic device 114 using solder. In another embodiment, heat sink base 104 is thermally coupled to a microelectronic device 114 using thermal grease.

One or more microelectronic devices 114 include any microelectronic device that may generate heat. In one embodiment, one or more microelectronic device(s) 114 are thermally coupled to cooling apparatus 100a for heat removal. In one embodiment, microelectronic device 114 is a processor. In an alternative embodiment, microelectronic device 114 comprises multiple processors. In an example embodiment, microelectronic device 114 represents a first processor in a flow arrangement involving multiple microelectronic devices that will be described in FIG. 1c.

FIG. 1b is a side view of another example microelectronic cooling apparatus 100b, according to but one example embodiment. In an embodiment, cooling apparatus 100b includes a heat sink base 120, primary plurality of fins $102_{1...n}$ (including at least fins $122_{1...n}$ and $124_{1...n}$), TEC 126, interface material 128, one or more microelectronic device(s) 130, and first 132 and second 134 pathways for a fluid to flow in opposing directions across the surfaces of fins $122_{1...n}$ and $124_{1...n}$ and/or heat sink base 120, each coupled as shown. In various embodiments, cooling apparatus 100b may incorporate all of the embodiments and/or combinations of embodiments described for cooling apparatus 100a.

In an embodiment, the cooling apparatus 100b includes a first pathway 132 for a fluid to flow between one or more fin(s) $122_{1...n}$ of the primary plurality of fins $102_{1...n}$ and/or across the surface of heat sink base 120. Fin(s) $122_{1...n}$ in the first pathway 132 are included in a first set of fin(s). A first set of fin(s) is defined to include any fins of a primary plurality $102_{1...n}$ in the first pathway 132, which may include other fin(s) not shown in apparatus 100b that may also be in the flow path of a fluid in the first pathway 132. The first pathway 132 includes at least the area between the first set of fin(s) $122_{1...n}$. A fluid in the first pathway 132 may flow across the fin(s) $122_{1...n}$ and/or the surface of heat sink base 120 in a direction indicated by the first pathway 132 arrow (i.e.—into the page in this example).

In an embodiment, cooling apparatus 100b includes a second pathway 134 for a fluid to flow between one or more fin(s) $124_{1...n}$ of the primary plurality of fins $102_{1...n}$ and/or across the surface of heat sink base 120. Fin(s) $124_{1...n}$ in the second pathway 134 are included in a second set of fin(s). A second set of fin(s) is defined to include any fins of the primary plurality $102_{1...n}$ in the second pathway 134, which may include other fin(s) not shown in apparatus 100b that may also be in the flow path of a fluid in the second pathway 134. The second pathway 134 includes at least the area between the second set of fin(s) $124_{1...n}$. The fluid in the second pathway 134 flows across the fin(s) $124_{1...n}$ and/or the surface of heat sink base 120 in a direction opposite or substantially opposite the direction of the fluid flow in the first pathway 132. The fluid in the second pathway 134 may flow in a direction indicated by the second pathway 134 arrow (i.e.—out of the page in this example).

In one embodiment, one or more heat sink base(s) 104, 120 are able to thermally couple with one or more microelectronic device(s) 114, 130. A primary plurality of fins $102_{1...n}$ may be thermally coupled with the one or more heat sink base(s) 104, 120. A cooling apparatus in accordance with this embodiment includes a first pathway 116, 132 for a fluid to flow across at least one or more fin(s) $106_{1...n}$, $122_{1...n}$ of the primary plurality of fins $102_{1...n}$ defining a first set of fin(s) $106_{1...n}$, $122_{1...n}$. A cooling apparatus in accordance with this embodiment also includes a second pathway 118, 134 for a fluid to flow across at least one or more fin(s) $108_{1...n}$, $124_{1...n}$ of the primary plurality $102_{1...n}$ that are not included in the first set of fin(s) defining a second set of fin(s) $108_{1...n}$, $124_{1...n}$ in a general direction that is opposite the general direction of fluid flow in the first pathway 116, 132.

In an example embodiment, cooling apparatus 100b may be adapted to thermally couple with a microelectronic device 114 that represents a second processor in an example flow arrangement involving multiple microelectronic devices (See FIG. 1c).

FIG. 1c is a view of an example flow arrangement 100c using apparatuses similar to those depicted in FIG. 1a and FIG. 1b, according to but one example embodiment (hence the arrows 154, 156 from FIGS. 1a-1b to FIG. 1c indicating how the figures may be arranged). According to an example embodiment, flow arrangement 100c includes a first microelectronic cooling apparatus 150 for a first microelectronic device and a second microelectronic cooling apparatus 152 for a second microelectronic device, each arranged as shown. In one embodiment, the first and second microelectronic devices are a first and second processor respectively.

In an embodiment, fins $136_{1...n}$ and $138_{1...n}$ of a primary plurality of fins are in a first pathway 144 defining a first set of fins. First pathway 144 may be an area where a fluid may flow across at least a portion of cooling apparatuses 150 and 152 to remove heat from the cooling apparatuses. Arrows associated with a first pathway 144 indicate a general direction for a fluid flow in the first pathway 144.

In an embodiment, fins $140_{1...n}$ and $142_{1...n}$ of a primary plurality of fins are in a second pathway 146 defining a second set of fins. Second pathway 146 is an area where a fluid may flow across at least a portion of cooling apparatuses 150 and 152 to remove heat from the cooling apparatuses in a direction opposite the direction of the fluid flow in the first pathway 144. Arrows associated with second pathway 146 indicate a general direction for a fluid flow in the second pathway 146.

In one embodiment, fins $136_{1...n}$ correspond with fins $108_{1...n}$ and fins $140_{1...n}$ correspond with fins $106_{1...n}$. Also, fins $138_{1...n}$ correspond with fins $124_{1...n}$ and fins $142_{1...n}$ correspond with fins $122_{1...n}$. For example, a TEC 110 may be embedded between fins $140_{1...n}$ and a heat sink base associated with apparatus 150 and a TEC 126 may be embedded between fins $138_{1...n}$ and a heat sink base associated with apparatus 152.

In an embodiment, a barrier 148 is used to separate a first pathway 144 from a second pathway. Such barrier 148 may reduce turbulence and mixing of flows. A variety of suitable materials may be used for a barrier. In one embodiment, a barrier 148 is a foil. In another embodiment, a barrier 148 is a thin plastic. In other embodiments, no barrier 148 is placed between the first 144 and second 146 pathways. The fins themselves may provide a sufficient barrier between the pathways.

Figure 2:
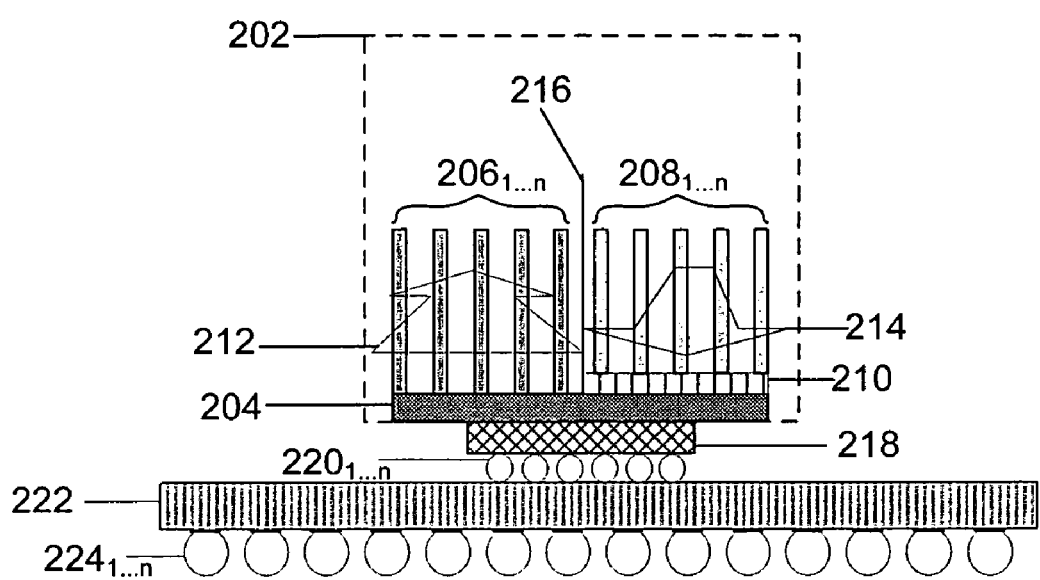
FIG. 2 is a side view of an example microelectronic cooling apparatus coupled with a microelectronic device, according to but one example embodiment.

FIG. 2 is a side view of an example microelectronic cooling apparatus coupled with a microelectronic device 200, according to but one example embodiment. In one embodiment, a microelectronic cooling apparatus 202 includes a heat sink base 204, fins $206_{1...n}$ and $208_{1...n}$, TEC 210, first pathway 212, second pathway 214, and barrier 216, each coupled as shown. Cooling apparatus 202 may incorporate embodiments and suitable combinations of embodiments already described in FIGS. 1a-1c. Cooling apparatus 202 may also represent embodiments and combinations of embodiments that will be described in FIGS. 3a-3e and FIG. 4.

In an embodiment, a cooling apparatus 202 is thermally coupled with one or more microelectronic device(s) 218. In an embodiment, microelectronic device 218 is a processor. In another embodiment, microelectronic device 218 is an integrated circuit die. In another embodiment, one or more microelectronic device(s) 218 include two processors in line. In yet another embodiment, one or more microelectronic device(s) 218 include multiple processors.

According to one embodiment, one or more microelectronic device(s) 218 are coupled with a substrate 222 via solder bumps $220_{1...n}$. A substrate 222 may be further coupled with other systems, components or devices via solder balls $224_{1...n}$. One or more microelectronic device(s) 220 may be coupled with another device through such pathway. In one embodiment, another device includes memory. One or more microelectronic device(s) 220 may be coupled with other devices, components, or systems using alternative pathways and is not limited in this regard. For example, solder bumps may be replaced with other suitable electrical interconnects, etc. Although a ball-grid array package is depicted in the example illustration, other package embodiments are also suitable including flip-chip array packages among others.

FIG. 3a is a side view of an example microelectronic cooling assembly 300a, according to but one example embodiment. In accordance with one embodiment, cooling assembly 300a includes a heat sink base 302, primary plurality of fins $304_{1...n}$, microelectronic device 306, one or more heat pipe(s) 308, secondary plurality of fins $310_{1...n}$, TEC 312, interface material 314, and first pathway 316, each coupled as shown. In one embodiment, heat sink base 302 and primary plurality of fins $304_{1...n}$ are part of a cooling apparatus described already in embodiments for FIGS. 1a-1c and 2. For example, cooling assembly 300a may include a first pathway 316 similar to those previously described.

In an embodiment, one or more heat pipe(s) 308 are thermally coupled with a heat sink base 302. In one embodiment, one or more heat pipe(s) are embedded in heat sink base 302 as depicted. A heat pipe may be a pipe-like container with a liquid that evaporates into a gas when it is heated. The gas may travel to a cooler end of the pipe, condense back into liquid and return via a wick to a hotter end of the pipe.

In an embodiment, one or more heat pipe(s) 308 are thermally coupled with one or more heat sink base(s) 302. A secondary plurality of fins $310_{1...n}$ may be thermally coupled with the one or more heat pipe(s) 308 to remove and dissipate heat from the one or more heat pipe(s) 308. A secondary plurality of fins are fins that are associated with a remote heat removal mechanism.

In another embodiment, a TEC 312 is thermally coupled with one or more heat pipe(s) 308. TEC 312 may further be coupled with one or more fin(s) of a secondary plurality of fins $310_{1...n}$. TEC 312 may be thermally coupled with one or more heat pipe(s) 308 and one or more fin(s) of a secondary plurality of fins $310_{1...n}$ using an interface material 314. In one embodiment interface material 314 is solder. In another embodiment, interface material 314 is thermal grease.

In one embodiment, one or more fin(s) of a secondary plurality of fins $310_{1...n}$ in the first pathway 316 define a third set of fins. In other embodiments, cooling assembly 300b is adapted to thermally couple with a second microelectronic device 322 in a flow arrangement for cooling multiple processors that will be described in more detail below (See FIG. 3e for an example).

FIG. 3b is another side view of an example microelectronic cooling assembly 300b, according to but one example embodiment. In accordance with one embodiment, cooling assembly 300b includes a heat sink base 318, primary plurality of fins $320_{1...n}$, microelectronic device 322, one or more heat pipe(s) 324, secondary plurality of fins $326_{1...n}$, TEC 328, interface material 330, and second pathway 332, each coupled as shown. In one embodiment, heat sink base 318 and secondary plurality of fins $326_{1...n}$ are part of a cooling apparatus described already in embodiments for FIGS. 1a-1c, 2 and 3a. For example, cooling assembly 300b may include a first pathway 316 similar to those previously described.

In one embodiment, one or more fin(s) of a secondary plurality of fins $326_{1...n}$ in the second pathway 332 define a fourth set of fins. In other embodiments, cooling assembly 300a is adapted to thermally couple with a first microelectronic device 306 in a flow arrangement for cooling multiple processors that will be described in more detail below (See FIG. 3e for an example).

FIG. 3c is a top view of an example microelectronic cooling assembly 300c similar to the assembly depicted in FIG. 3a, according to but one example embodiment. In one embodiment, cooling assembly 300c includes a heat sink base 334, primary plurality of fins $336_{1...n}$, one or more heat pipe(s) 338, remote heat removal mechanism 340, and a first pathway 316 for a fluid with associated arrows indicating a general direction of flow. Remote heat removal mechanism 340 may include at least one or more heat pipe(s) 338. In an embodiment, remote heat removal mechanism 340 further includes a TEC 312 thermally coupled with one or more heat pipe(s) 338. Alternatively, remote heat removal mechanism 340 includes one or more fin(s) of a secondary plurality of fins $310_{1...n}$ thermally coupled with the one or more heat pipe(s) 338. In another embodiment, a TEC 312 is embedded between one or more heat pipe(s) 338 and one or more fin(s) of a secondary plurality of fins $3_{1...n}$.

FIG. 3d is a top view of another example microelectronic cooling assembly 300d similar to the assembly depicted in FIG. 3b, according to but one example embodiment. In one embodiment, cooling assembly 300d includes a heat sink base 346, primary plurality of fins $348_{1...n}$, one or more heat pipe(s) 350, remote heat removal mechanism 352, and a second pathway 332 for a fluid with associated arrows indicating a general direction of flow. Remote heat removal mechanism 352 may include at least one or more heat pipe(s) 350. In an embodiment, remote heat removal mechanism 352 further includes a TEC 328 thermally coupled with one or more heat pipe(s) 350. Alternatively, remote heat removal mechanism 352 includes one or more fin(s) of a secondary plurality of fins $326_{1...n}$ thermally coupled with the one or more heat pipe(s) 350. In another embodiment, a TEC 328 is embedded between one or more heat pipe(s) 350 and one or more fin(s) of a secondary plurality of fins $326_{1...n}$.

Secondary plurality of fins includes fins that are associated with a remote heat removal mechanism 340, 352. Primary plurality of fins includes fins that are associated with a heat sink base 334, 346 that is adapted to thermally couple with a microelectronic device 306, 322.

FIG. 3e is a top view of an example flow arrangement 300e using assemblies similar to those depicted in FIG. 3c and FIG. 3d, according to but one example embodiment. In an embodiment, a flow arrangement 300e includes cooling elements in a first pathway 316 for a fluid to flow across the elements in a general direction indicated by associated arrows to remove heat. Cooling elements in a first pathway 316 include one or more fin(s) of a primary plurality of fins $336_{1...n}$, one or more heat pipe(s) 338, and remote heat removal mechanism 340. Flow arrangement 300e also includes cooling elements in a second pathway 332 for a fluid to flow across the elements in a general direction indicated by associated arrows to remove heat. In an embodiment, the general direction of the flow in the second pathway 332 is substantially opposite the direction of the flow in the first pathway 316. Cooling elements in a second pathway 332 include one or more fin(s) of a primary plurality of fins $348_{1...n}$, one or more heat pipe(s) 350, and remote heat removal mechanism 352.

In an embodiment, cooling elements in a first pathway 316 further include one or more heat pipe(s) 350 and cooling elements in a second pathway 332 further include one or more heat pipe(s) 338.

According to one embodiment, a first heat pipe 338 is thermally coupled with a first heat sink base 334, which may be adapted to thermally couple with a first microelectronic device 306. One or more fin(s) of a secondary plurality of fins $310_{1...n}$ are in a first pathway 316 defining a third set of fins. Third set of fins $310_{1...n}$ are thermally coupled with the first heat pipe 338 in an arrangement that allows a fluid of the first pathway 316 to flow across the third set of fins $310_{1...n}$. In accordance with an embodiment, a second heat pipe 350 is thermally coupled with a second heat sink base 346, which may be adapted to thermally couple with a second microelectronic device 322. One or more fin(s) of a secondary plurality of fins $326_{1...n}$ are in a second pathway 332 defining a fourth set of fins. Fourth set of fins $326_{1...n}$ are thermally coupled with the second heat pipe 338 in an arrangement that allows a fluid of the second pathway 332 to flow across the fourth set of fins $326_{1...n}$.

In one embodiment, assemblies 300c and 300d are adapted to couple in a flow arrangement as shown in 300e. In another embodiment, assembly 300c is thermally coupled with a first microelectronic device and assembly 300d is thermally coupled with a second microelectronic device.

Flow arrangement 300e may provide two parallel cooling paths: one through a primary plurality of fins $336_{1...n}$ and $348_{1...n}$ coupled to a heat sink base that may be thermally coupled with a microelectronic device, and another through a remote heat removal mechanism 340, 352. Arrangement 300e may provide flexibility for active feedback control because each microelectronic device may work independently without affecting the performance of the other. Such arrangement may reduce TEC power consumption in situations where one microelectronic device does not work at maximum thermal design power capability. For example, if one microelectronic device is idle, TEC power is not needed to cool it. In one embodiment, each remote heat removal mechanism 340, 352 has its own independent active feedback controller.

FIG. 4 is a flowchart of an example method 400 for microelectronic cooling, according to but one example embodiment. In an embodiment, method 400 includes providing one or more heat sink(s) to couple with one or more microelectronic device(s) 402, providing a plurality of fins thermally coupled with the one or more heat sink(s) 404, causing a fluid to flow in a first pathway across one or more fin(s) 406, and causing a fluid to flow in a second pathway across one or more fins 408.

In one embodiment, causing a fluid to flow in a second pathway 408 includes causing a fluid to flow in a second pathway in a direction substantially opposite in direction to the fluid flow in a first pathway. In another embodiment, causing a fluid to flow in a second pathway 408 includes causing a fluid to flow across the remaining one or more fin(s) of the provided plurality of fins that are not in the first pathway.

In other embodiments, causing a fluid to flow 406, 408 is actuated by a controller that may use temperature of the microelectronic device to determine whether to actuate a blower or other fluid-moving device to cause fluid to flow in the first and/or second pathways. Alternatively, causing a fluid to flow 404, 406 may be selectively enabled and disabled based on system or device conditions such as, for example, the temperature of microelectronic device 110 or a temperature difference between microelectronic device 110 and an ambient temperature. Additional and/or different conditions may also be used.

Cooling apparatuses used in method 400 may accord with various embodiments of one or more cooling apparatuses(s) previously described.

Various operations may be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. A microelectronic cooling apparatus comprising:
   one or more heat sink base(s) to thermally couple with one or more microelectronic device(s);
   a primary plurality of fins thermally coupled with the one or more heat sink base(s);
   a first pathway for a fluid to flow across at least one or more fin(s) of the primary plurality of fins defining a first set of fin(s) to remove heat from the first set of fin(s); and
   a second pathway for the fluid to flow across at least one or more fin(s) of the primary plurality that are not included in the first set of fin(s), defining a second set of fin(s), in a direction substantially opposite the direction of the fluid flow in the first pathway to remove heat from the second set of fin(s);
   a first heat pipe thermally coupled with a first heat sink base, the first heat sink base to thermally couple with a first microelectronic device;
   one or more fin(s) of a secondary plurality of fins defining a third set of fins, the third set of fins thermally coupled with the first heat pipe in an arrangement that allows the fluid of the first pathway to flow across the third set of fins to remove heat from the third set of fins;
   a second heat pipe thermally coupled with a second heat sink base, the second heat sink base to thermally couple with a second microelectronic device; and
   one or more fin(s) of the secondary plurality of fins that are not included in the third set of fins defining a fourth set of fins, the fourth set of fins thermally coupled with the second heat pipe in an arrangement that allows the fluid of the second pathway to flow across the fourth set of fins to remove heat from the fourth set of fins.

2. A cooling apparatus according to claim 1 wherein the one or more heat sink base(s) comprise:
   a first heat sink base to thermally couple with a first microelectronic device; and
   a second heat sink base to thermally couple with a second microelectronic device.

3. A cooling apparatus according to claim 2 wherein one or more fin(s) of the first set of fins are thermally coupled with the first heat sink base and one or more fin(s) of the second set of fins are thermally coupled with the second heat sink base, further comprising
   a first thermoelectric cooler thermally coupled between the first heat sink base and the fins of the first set of fins that are thermally coupled with the first heat sink base; and
   a second thermoelectric cooler thermally coupled between the second heat sink base and the fins of the second set of fins that are thermally coupled with the second heat sink base.

4. A cooling apparatus according to claim 1 further comprising:
   a barrier to separate the first pathway from the second pathway.

5. A cooling apparatus according to claim 1 further comprising:
   one or more thermoelectric cooler(s) thermally coupled with at least a portion of the one or more heat sink base(s).

6. A cooling apparatus according to claim 1 wherein the one or more heat sink base(s) comprise one or more vapor chamber(s).

7. A cooling apparatus according to claim 1 wherein the one or more heat sink base(s) are thermally coupled with one or more microelectronic device(s).

8. A cooling apparatus according to claim 1 further comprising:
   one or more heat pipe(s) thermally coupled with the one or more heat sink base(s); and
   a secondary plurality of fins thermally coupled with the one or more heat pipe(s).

9. A cooling apparatus according to claim 8 further comprising:
   one or more thermoelectric cooler(s) thermally coupled with the one or more heat pipe(s) and the secondary plurality of fins.

10. A cooling apparatus according to claim 1 further comprising:
    a first thermoelectric cooler thermally coupled with the first heat pipe and the third set of fins;
    a second thermoelectric cooler thermally coupled with the second heat pipe and the fourth set of fins.

11. A microelectronic cooling method comprising:
    providing one or more heat sink base(s) to thermally couple with one or more microelectronic device(s);
    providing a primary plurality of fins thermally coupled with the one or more heat sink base(s);

causing a fluid to flow in a first pathway across at least one or more fin(s) of the primary plurality of fins defining a first set of fin(s) to remove heat from the first set of fin(s); and causing the fluid to flow in a second pathway in a direction substantially opposite the direction of the fluid in the first pathway across at least one or more fin(s) of the primary plurality that are not included in the first set of fin(s) defining a second set of fin(s) to remove heat from the second set of fin(s);

providing a first heat pipe thermally coupled with a first heat sink base, the first heat sink base to thermally couple with a first microelectronic device;

providing one or more fin(s) of a secondary plurality of fins defining a third set of fins thermally coupled with the first heat pipe in an arrangement that allows the fluid of the first pathway to flow across the third set of fins to remove heat from the third set of fins;

providing a second heat pipe thermally coupled with a second heat sink base, the second heat sink base to thermally couple with a second microelectronic device; and providing one or more fin(s) of the secondary plurality of fins that are not included in the third set of fins defining a fourth set of fins thermally coupled with the second heat pipe in an arrangement that allows the fluid of the second pathway to flow across the fourth set of fins to remove heat from the fourth set of fins.

12. A cooling method according to claim 11 wherein providing one or more heat sink base(s) comprises:

providing a first heat sink base to thermally couple with a first microelectronic device; and providing a second heat sink base to thermally couple with a second microelectronic device.

13. A cooling method according to claim 12 further comprising:

providing a first thermoelectric cooler thermally coupled with the first heat sink base and the fins of the first set of fins that are thermally coupled with the first heat sink base; and providing a second thermoelectric cooler thermally coupled with the second heat sink base and the fins of the second set of fins that are thermally coupled with the second heat sink base.

14. A cooling method according to claim 11 further comprising:

providing a barrier to separate the first pathway from the second pathway.

15. A cooling method according to claim 11 further comprising:

providing one or more thermoelectric cooler(s) thermally coupled with at least a portion of the one or more heat sink base(s).

16. A cooling method according to claim 11 wherein the one or more heat sink base(s) comprise one or more vapor chamber(s).

17. A cooling method according to claim 11 wherein the one or more heat sink base(s) are thermally coupled with one or more microelectronic device(s).

18. A cooling method according to claim 11 further comprising:

providing one or more heat pipe(s) thermally coupled with the one or more heat sink base(s); and providing a secondary plurality of fins thermally coupled with the one or more heat pipe(s).

19. A cooling method according to claim 18 further comprising:

providing one or more thermoelectric cooler(s) thermally coupled with the one or more heat pipe(s) and the secondary plurality of fins.

20. A cooling method according to claim 11 further comprising:

providing a first thermoelectric cooler thermally coupled with the first heat pipe and the third set of fins;

providing a second thermoelectric cooler thermally coupled with the second heat pipe and the fourth set of fins.

21. A microelectronic cooling system comprising:

one or more heat sink base(s) thermally coupled with one or more microelectronic device(s);

a primary plurality of fins thermally coupled with the one or more heat sink base(s);

a first pathway for a fluid to flow across at least one or more fin(s) of the primary plurality of fins defining a first set of fin(s) to remove heat from the first set of fin(s);

a second pathway for the fluid to flow across at least one or more fin(s) of the primary plurality that are not included in the first set of fin(s), defining a second set of fin(s), in a direction substantially opposite the direction of the fluid flow in the first pathway to remove heat from the second set of fin(s);

another device electrically coupled with the one or more microelectronic device(s);

a first heat pipe thermally coupled with a first heat sink base, the first heat sink base thermally coupled with a first microelectronic device;

one or more fin(s) of a secondary plurality of fins defining a third set of fins thermally coupled with the first heat pipe in an arrangement that allows the fluid of the first pathway to flow across the third set of fins to remove heat from the third set of fins;

a second heat pipe thermally coupled with a second heat sink base, the second heat sink base thermally coupled with a second microelectronic device; and one or more fin(s) of the secondary plurality of fins that are not included in the third set of fins defining a fourth set of fins thermally coupled with the second heat pipe in an arrangement that allows the fluid of the second pathway to flow across the fourth set of fins to remove heat from the fourth set of fins.

22. A cooling system according to claim 21 wherein the one or more heat sink base(s) comprise:

a first heat sink base thermally coupled with a first microelectronic device; and a second heat sink base thermally coupled with a second microelectronic device.

23. A cooling system according to claim 21 further comprising:

one or more thermoelectric cooler(s) thermally coupled with at least a portion of the one or more heat sink base(s).

24. A cooling system according to claim 21 further comprising:

one or more heat pipe(s) thermally coupled with the one or more heat sink base(s); and a secondary plurality of fins thermally coupled with the one or more heat pipe(s).

25. A cooling system according to claim 21 further comprising:
   one or more thermoelectric cooler(s) thermally coupled with the one or more heat pipe(s) and the secondary plurality of fins.

26. A cooling system according to claim 21 wherein the one or more microelectronic device(s) are processors and the another device is memory.

* * * * *